United States Patent

Cox, Jr. et al.

[15] 3,689,684

[45] Sept. 5, 1972

[54] LEAD FRAME CONNECTOR AND ELECTRONIC PACKAGES CONTAINING SAME

[72] Inventors: John J. Cox, Jr.; Richard G. Fisher, both of Wilmington, Del.

[73] Assignee: E. I. du Pont de Nemours and Company, Wilmington, Del.

[22] Filed: Feb. 5, 1971

[21] Appl. No.: 113,007

[52] U.S. Cl. ......174/68.5, 174/DIG. 3, 317/101 CC, 317/101 CP, 29/193, 339/17 R

[51] Int. Cl. ............................................H05k 1/06

[58] Field of Search ....174/DIG. 3, 525, 52 PE, 68.5; 317/101 CC, 101 A, 101 CP; 339/17 LC, 17 C; 29/625, 628, 193, 193.5

[56] References Cited

FOREIGN PATENTS OR APPLICATIONS

| | | | |
|---|---|---|---|
| 1,467,190 | 12/1966 | France | 339/17 LC |
| 1,178,395 | 1/1970 | Great Britain | 174/DIG. 3 |

*Primary Examiner*—Darrell L. Clay
*Attorney*—James A. Forstner

[57] ABSTRACT

This invention relates to a lead frame connector utilizing mechanical clamping features to hold the lead frame in place on a dielectric substrate. The lead frame is held onto the substrate by its clamping mechanism while a bonding operation is performed. After the bonding operation has been performed, the clamping features of the lead frame assist in keeping it rigid and in increasing the strength of the bonded joint. The lead frame can be attached to various electronic devices, such as semiconductor packages, hybrid circuits, and passive elements.

4 Claims, 3 Drawing Figures

INVENTORS
JOHN J. COX, JR.
RICHARD G. FISHER

John J. Klocko III
ATTORNEY

LEAD FRAME CONNECTOR AND ELECTRONIC PACKAGES CONTAINING SAME

BACKGROUND OF THE INVENTION

Numerous electronic devices, particularly semiconductor integrated circuits, traditionally are packaged in a variety of shapes and sizes in packages constructed of ceramics, plastics, metals, glasses, etc. Many of these packages are designed to be hermetically sealed. A particular type of each construction which is received with great favor in the industry is one composed of ceramics which have been metallized with compositions based on refractory metals, such as molybdemum, molybdemum/manganese, tungsten, etc. Refractory metallizing techniques produce strong hermetic joints to the ceramic, but because of low conductivity, lack of metallurgical compatibility with the semiconductor devices or lack of metallurgical compatibility with bonding techniques, these metallizations must be plated with metals such as nickel and gold. Although this technique provides packages having strong leads and hermetic seals, it is a relatively expensive process due to the many steps involved. Furthermore, it is extremely difficult to plate electrically isolated regions or to obtain uniform plating on substrates having large and small areas of metallization.

A particular process step which is expensive and often subject to low yields is the electroplating step. Moreover, a limitation of electroplating resides in the fact that not all metals can be satisfactorily deposited. The semiconductor package user is therefore confronted with certain metallurgical problems of compatibility. A specific compatibility problem is emphasized by the well-known use of gold on a package which is required to interface with aluminum wires coming from a semiconductor device. This aluminum-gold combination, when subjected to high temperatures, can result in the formation of certain intermetallic compounds which degrade the strength and reliability of the metallurgical bond between the aluminum and the gold. This phenomena is often referred to as "purple plague."

There are other available techniques for metallizing ceramics, such as thin film sputtered or evaporated metallizing, and thick film precious metal metallizing. Both of these techniques have limitations in the construction of semiconductor packages. In particular, the family of materials, commonly referred to as thick film materials, would be very desirable to use for making semiconductor packages. These materials, which are easily applied by techniques such as screen printing, can be used on dielectric substrates, processed at temperatures significantly lower than those for the refractory metal systems, and do not require electroplating. It would be economically desirable to use thick film materials for the construction of semiconductor packages were it not for specific limitations. A particularly noteworthy limitation of the thick film materials is that they cannot be used to attach lead frames by the conventional technique of brazing with a high-melting (e.g., 700°–800° C.) alloy in a reducing atmosphere. The reducing atmosphere generally results in decomposition of the glassy phase in a thick film material; also, the molten braze alloy, which has a high solubility for the precious metals involved, removes the metals from the substrate by leaching.

Suitable bonding techniques which do not have these difficulties are available. However, these techniques have other limitations. In particular, soldering techniques may be tried but the melting points of soldering materials are considerably lower than subsequent processing temperatures to which the package is subjected. For example, the highest melting point of a conventional solder which is compatible with thick film materials is about 300° C. This is approximately 150° C. lower than the temperatures which the package will come in contact with during the attachment of the semiconductor die by melting of the gold-silicon eutectic phase. Therefore, if a conventional lead frame were attached to the package by one of the soft solders, the solder would be melted and the lead frame detached during the process of inserting the semiconductor die into the package.

Therefore, it is desirous to make packages constructed from thick film materials, it is necessary to provide a suitable lead frame which, when attached, will endure subsequent processing operations and yet maintain the functional requirements of high lead strength. The lead frames of this invention have been developed to overcome many of the deficiencies of the prior art.

SUMMARY OF THE INVENTION

This invention relates to a metallic lead frame having an elongated bar with a plurality of spaced leads extending laterally therefrom, each lead having a portion formed at its outer end into a clamp. In addition, this invention also involves the lead frame fitted and usually bonded onto a dielectric substrate which may contain a semiconductor device, passive elements, hybrid circuits and combinations thereof. The method of attaching the novel metallic lead frame to a ceramic substrate is also part of this invention.

DESCRIPTION OF THE PREFERRED EMBODIMENTS

Figures 1, 2, 3:
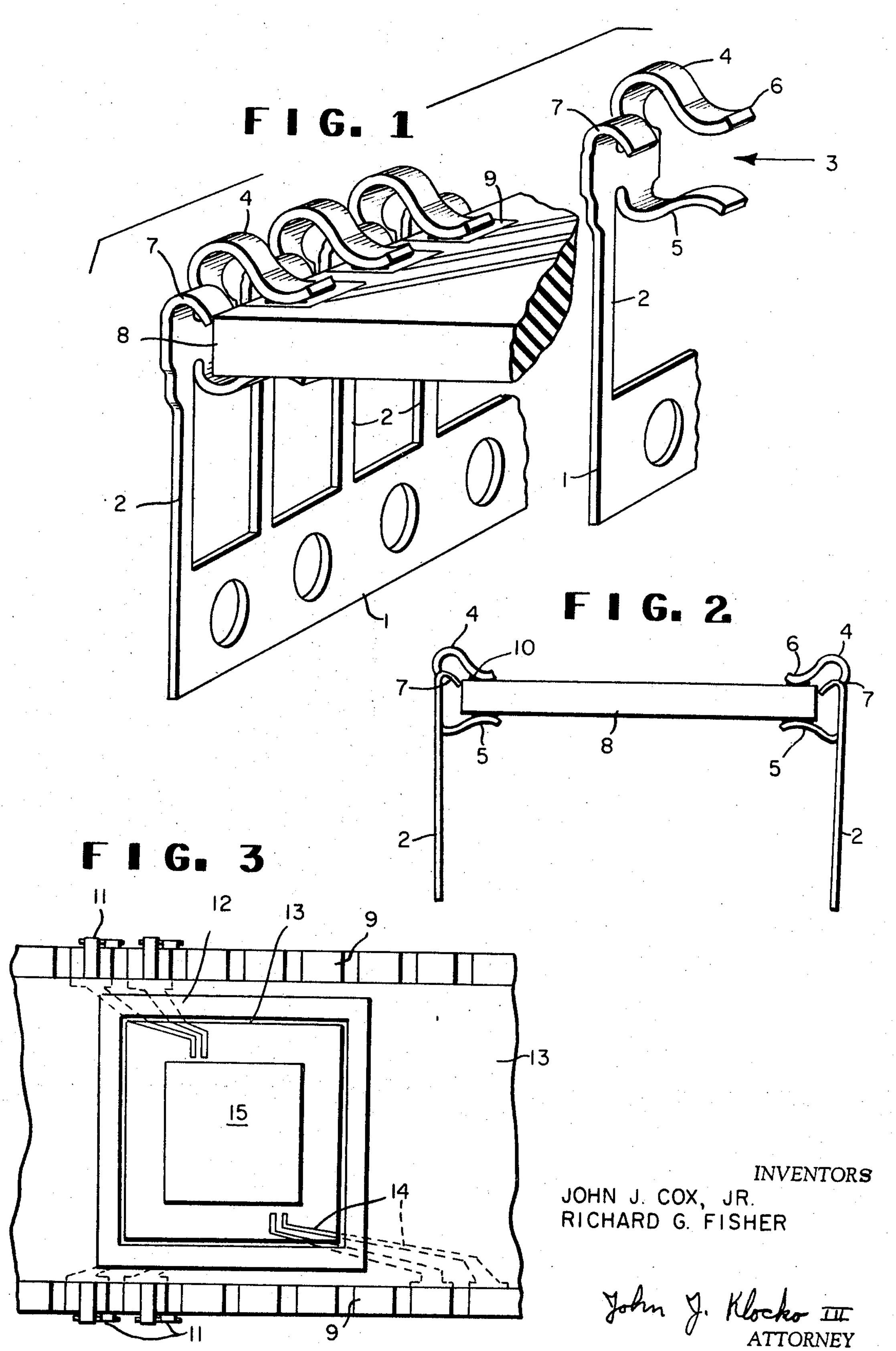
FIG. 1 is a perspective view of a metallic lead frame alone, and a metallic lead frame attached to a ceramic substrate.
FIG. 2 is a side view of two lead frames attached to a ceramic substrate.
FIG. 3 is a top view of a semiconductor package having a lead frame attached thereto.

A lead frame embodying the invention is shown in FIG. 1 and comprises an elongated bar 1, a plurality of spaced leads 2 extending laterally therefrom, each lead having a portion formed at its outer end into a clamp 3. The clamp has upper end 4 and bottom end 5 wherein the upper end is in the form of an arch with a terminal tab 6. Also, shown is a laterally offset tab 7 which is adapted to stop the clamp at a predetermined distance from substrate 8. The clamp has been soldered to terminal pads 9 to form a lead frame securely attached to the ceramic substrate.

The side view of FIG. 2 clearly shows the shape of the clamp as well as the shape of the stop tab 7. In this particular embodiment lead 2 is at right angles to substrate 8. It should be noted that solder fillet 10 provides a means for increased adhesion between the clamp and the substrate.

FIG. 3 is a specific adaptation wherein the lead frame is attached to a semiconductor package. For purposes of simplicity the drawing only shows two leads 11 on opposite sides of the ceramic substrate. The lead frame of this invention makes it possible to use thick film materials: metallurgical seal ring 12, insulating dielectric 13, conducting fingers 14, semiconductor die attachment region 15, and terminal pads 9.

In a typical process for producing packages similar to FIG. 3, a ceramic substrate is metallized, for example, by screen printing a palladium/silver conductor paste onto the substrate. The substrate material can be any of the well-known plastics, glasses or ceramics including alumina, beryllium oxide, steatite, zircon, aluminum silicate, zirconium dioxide, titanium dioxide, magnesium silicates, etc. and various combinations thereof. The thick film material can be any of the conventional materials involving noble metals (e.g., Pd, Pt, Ag, Au, Ru, Ir, Os, Re), inorganic binder ( e.g., glass, glass precursors, $Bi_2O_3$, etc.), and optionally, a liquid vehicle. Typical thick film materials are disclosed in U.S. Pat. Nos. 2,490,399; 2,924,540; 3,052,573; 3,347,799; 3,350,341; 3,385,799; 3,413,240; 3,437,892; 3,536,508 and 3,553,109.

A dielectric or insulating layer may then be applied over selected regions of the dielectric substrate containing thick film materials, and optionally, a thick film metallic pattern may be provided for sealing. It is the lead frame of this invention that enables one to employ conventional thick film materials to construct various electronic circuits or packages suitable for hermetic or non-hermetic sealing which are suitably connectable to other elements in a packaging system (e.g., printed circuit boards, connectors, etc.) The lead frame utilizes a clamping mechanism to hold the lead frame in place while a bonding operation is performed; consequently, the lead frame does not become detached as did prior lead frames. Any suitable means for bonding may be employed; however, soldering is a preferred means and is illustrated in the drawings. After the bonding operation has been performed, the clamp of the lead frame assists in keeping the lead frame rigid and increases the strength of the bonded joint. The bonding operation, although not absolutely necessary, enhances reliable electrical continuity between the lead frame and the metallized substrate.

A particularly suitable lead frame is shown in FIG. 1 wherein a C-shaped or arch-type clamp is an integral part of each individual lead element. The clamp is mechanically forced onto the substrate such that the substrate is secured between the two outwardly projecting members of the clamp. The C-shaped clamp contacts the substrate on the top and bottom surfaces, either or both of which may contain a metallized pad which provides electrical connection to the other elements on the top and/or bottom surfaces of the substrate. The leads may be provided in individual form but in most instances will be connected by the elongated shorting bar or tie bar 1. The tie bar permits lead frames to be produced automatically in progressive stamping equipment and keeps them in proper relationship with one another so that they can be inserted in groups of two or more leads, depending on the size of the ceramic substrate or package involved. The lead frame may be composed of any well-known materials which are used in the electronic industry. Typical examples include Kovar, alloys of nickel, iron, cobalt, copper, etc.

The paricular configuration, size, shape or thickness of the clamping mechanism employed can be adapted to meet any specific mechanical and/or electrical requirements. Depending on the particular configuration of the lead and clamping mechanism employed, it may be necessary to provide separate strips of lead frame connectors for opposite sides of the substrate in order to insure that the leads on opposite sides of the substrate are in alignment with each other. Soldering of the lead frame to the substrate may be accomplished with conventional techniques. One technique involves pre-tinning the pads on the substrate, inserting the lead frame and reflowing the solder, such as through the use of infrared or conventionally heated ovens. Another technique is to employ a particulate form of solder dispersed in a flux-type vehicle, wherein the solder paste is applied in stripes to sides of the package, inserting the lead frame and heating above the melting point of the solder. A particularly useflul heating method involves the use of focused infrared energy which will melt and flow the solder joining the lead frame without unduly heating other regions of the package. A third technique involves attaching a lead frame to the package, inverting the package and passing it through a wave soldering machine.

The lead frame may have a coating of a material which is easily wettable by the solder (e.g., tin, solder, gold, etc.) to insure firm bonding to the substrate. Normally, the solder is preferentially wetted onto the lead frame and onto the pads on the substrate in such a way that uniform solder fillets 10 are automatically formed in place. These solder fillets provide and insure additional strength to the joints.

The lead frame may be attached to the substrate either before or after a semiconductor device has been inserted, eutectically dibonded, wire bonded and sealed. It is simpler to attach the lead frame after the semiconductor device has been inserted, etc. However, because of the novel clamping features which hold the lead frame of this invention in position on the substrate, the lead frame may be soldered to the substrate with solders whose melting temperatures are lower than will be encountered in subsequent processing operations.

The lead frame of this invention permits the use of the lower cost thick film metallizing systems. It also permits the use of both sides of the substrate for circuitry since the clamping feature can provide electrical interconnection between the bottom and the top of the substrate. The lead frame is "self-jigging" in that the substrate and lead frame are held in proper relationship without the use of external holding mechanisms. The lead frame may be removed from the substrate and reattached in the event that the initial attachment becomes defective or if the lead frame need be replaced without adversely affecting the semiconductor device or hermetic seal. Because individual segments of the lead frame are flexibly attached to one another, the lead frame may be applied to packages other than rectilinear packages; for example, the lead frame may be formed around curvilinear package configurations. Most importantly, the lead frame of this invention exhibits excellent adherence to the substrate when soldered. This, of course, is due to many features but primarily due to the clamp and solder fillet adhesive coaction.

While the invention has been particularly shown and described with reference to preferred embodiments thereof, it will be understood by those skilled in the art that various changes in form and detail may be made therein without departing from the spirit and scope of the invention.

We claim:

1. As an article of manufacture, a metallic lead frame having an elongated bar with a plurality of spaced leads extending laterally therefrom, each lead having a portion formed at its outer end into a clamp, said clamp having upper and lower ends for engaging the top and bottom surfaces of a substrate, the upper end of the clamp having a portion in the form of an arch with a terminal tab, each lead having a laterally offset stop tab adapted to stop the lead at a predetermined distance from a substrate, said stop tab extending from said lead and being shorter than each of the upper and lower ends of the clamp, said stop tab havings its end disposed between said upper and lower ends of the clamp.

2. As an article of manufacture, a metallic lead frame according to claim 1 fitted onto a dielectric substrate having terminal pads thereon, at least one of the upper and lower ends of said clamp engaging said terminal pads on the substrate.

3. As an article of manufacture, a metallic lead frame according to claim 2 fitted onto a dielectric substrate, wherein the ends of said clamps of the lead frame which are in contact with said terminal pads on said substrate are soldered to said terminal pads.

4. As an article of manufacture, a dielectric substrate having opposite surfaces and a leading edge between said opposite surfaces; said substrate having at least one terminal pad on at least one of said opposite surfaces; said substrate having a metallic clamp with upper and lower ends engaging said opposite surfaces of said substrate and being disposed on any said terminal pad; said clamp being soldered to any said terminal pad; said clamp being part of a metallic lead which lead also has a laterally offset stop tab in abutment with said leading edge of said dielectric substrate, said stop tab being shorter than and its end being disposed between said upper and lower portions of said clamp.

* * * * *